United States Patent
Kiriyama et al.

(10) Patent No.: US 7,352,305 B2
(45) Date of Patent: Apr. 1, 2008

(54) METHOD AND CIRCUIT FOR INTERPOLATING ENCODER OUTPUT

(75) Inventors: Tetsuro Kiriyama, Kawasaki (JP); Ryuichi Koiso, Kawasaki (JP); Toshirou Yoshinaka, Kawasaki (JP)

(73) Assignee: Mitutoyo Corporation, Kawasaki-shi (JP)

( * ) Notice: Subject to any disclaimer, the term of this patent is extended or adjusted under 35 U.S.C. 154(b) by 0 days.

(21) Appl. No.: 11/461,556

(22) Filed: Aug. 1, 2006

(65) Prior Publication Data

US 2007/0035417 A1    Feb. 15, 2007

(30) Foreign Application Priority Data

Aug. 11, 2005   (JP) ............... 2005-233558

(51) Int. Cl.
*H03M 1/48* (2006.01)
(52) U.S. Cl. ................... 341/116; 341/111
(58) Field of Classification Search ........... 341/8, 341/11, 111, 116, 117
See application file for complete search history.

(56) References Cited

U.S. PATENT DOCUMENTS

| | | | |
|---|---|---|---|
| 4,556,885 A * | 12/1985 | Kurosawa | ............ 340/870.25 |
| 4,782,329 A | 11/1988 | Iijima et al. | |
| 4,989,073 A * | 1/1991 | Wagner | ............... 348/498 |
| 5,347,277 A * | 9/1994 | Nondahl et al. | ........... 341/116 |
| 5,646,496 A * | 7/1997 | Woodland et al. | ......... 318/632 |
| 5,815,089 A | 9/1998 | Katagiri et al. | |
| 6,326,908 B1 * | 12/2001 | Hoffman et al. | ............ 341/111 |
| 6,426,721 B1 * | 7/2002 | Obara | ............... 342/375 |
| 6,564,023 B2 * | 5/2003 | Takami et al. | ............... 399/50 |
| 7,009,535 B2 * | 3/2006 | Kanekawa et al. | ......... 341/116 |

FOREIGN PATENT DOCUMENTS

| | | |
|---|---|---|
| EP | 0331189 | 9/1989 |
| EP | 0455984 | 11/1991 |

* cited by examiner

*Primary Examiner*—Linh Nguyen
(74) *Attorney, Agent, or Firm*—Rankin, Hill & Clark LLP (57) ABSTRACT

Two-phase sinusoidal signals QA, QB output from an encoder are interpolated by sample-and-hold (S/H) circuits and A/D conversion (ADC) circuits, and data D is output in accordance with a data request signal RQ from exterior. For this interpolation of encoder output, a direction discrimination up/down counter is arranged near a two-phase square-wave uniform pulse generating circuit, and the data D is latched and output using a signal which is obtained by delaying the data request signal RQ. This can reduce synchronization errors between the data request signal RQ from exterior and the interpolated data, with an improvement in dynamic precision.

10 Claims, 11 Drawing Sheets

Fig.1

PRIOR ART

Fig.2

PRIOR ART

Fig.3

PRIOR ART

Fig.4

PRIOR ART

$X_{RQ}$ : Encoder position when RQ is input $D_{RQ}$ : Value of up/down counter latched with RQ2
→ same position as $X_{RQ}$

$$N = \frac{P_{CK1}}{P_{CK3}}$$

Fig.10

$$D = (\theta_{n-1} - \theta_n)\frac{m}{N} + \theta_n$$

METHOD AND CIRCUIT FOR INTERPOLATING ENCODER OUTPUT

CROSS-REFERENCE TO RELATED APPLICATION

The disclosure of Japanese Patent Application No. 2005-233558 filed Aug. 11, 2005 including specification, drawings and claims is incorporated herein by references in its entirety.

BACKGROUND OF THE INVENTION

1. Field of the Invention

The present invention relates to a method and a circuit for interpolating an encoder output. In particular, the invention relates to a method and a circuit for interpolating an encoder output, by which two-phase sinusoidal signals output from an encoder are interpolated through sample-and-hold and A/D conversion, thereby outputting data in accordance with a data request signal from exterior, suited to encoder (photoelectric type, magnetic type, electromagnetic induction type, capacitance type, etc.) outputting two-phase sinusoidal signals having a phase difference of 90° and laser length measuring machines.

2. Description of the Related Art

Encoders have working limits on the pitches of their scale grids. In order to measure distances finer than the scale grids, it is therefore necessary to subdivide and interpolate the spatial periods of phase changes of the sinusoidal signals output from the encoders. Various types of interpolation circuits have been conventionally used for this purpose.

Among the conventional methods is one based on A/D conversion. Because of limited operation time for A/D conversion and signal correction, this method requires discrete sampling for the A/D conversion. If the sampling time is long, it is impossible to establish precise synchronization with external trigger signals (data request signals) such as an origin signal and a servo control signal, thereby causing a shift in position.

Figure 1:
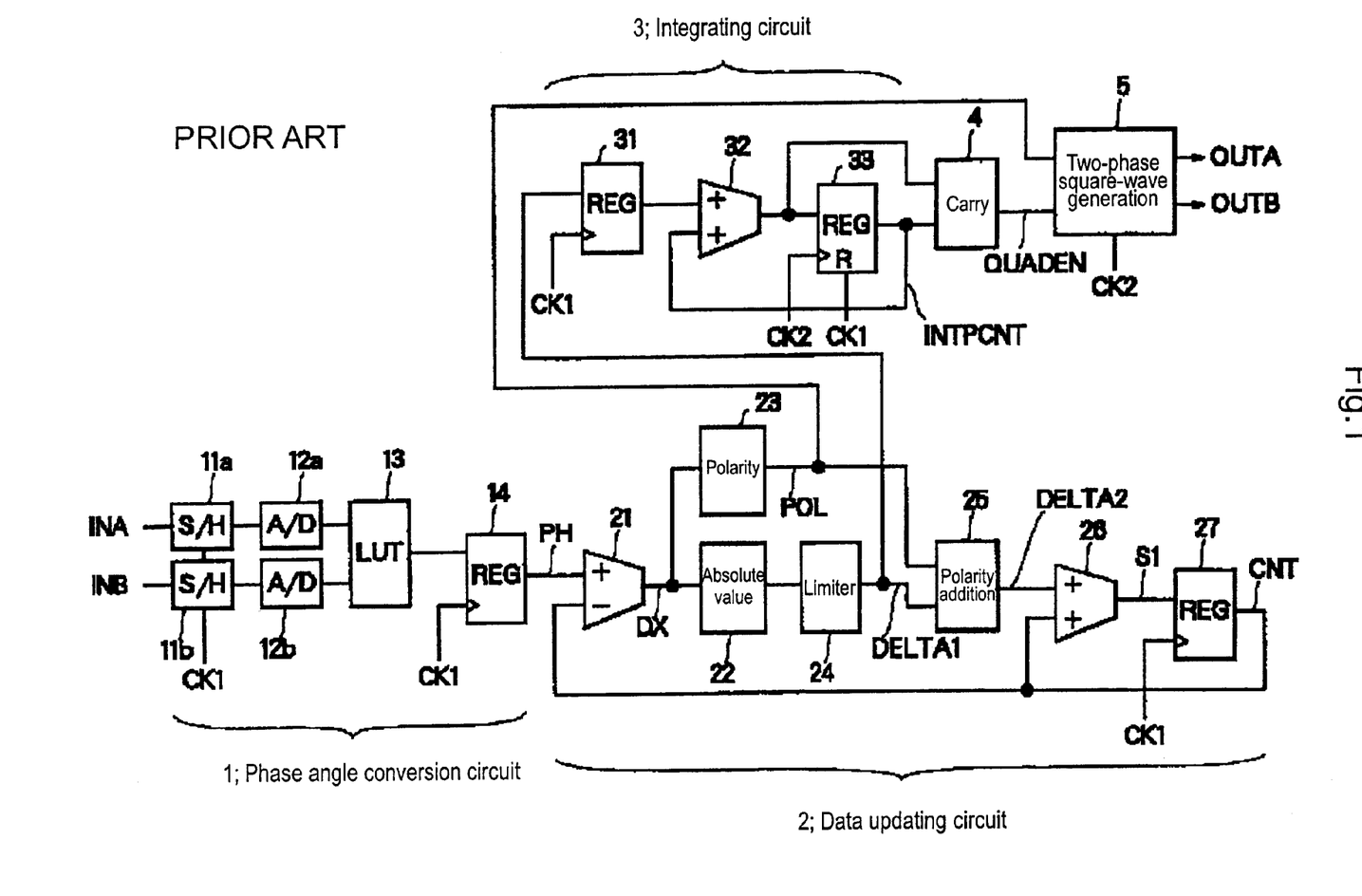
FIG. 1 is a circuit diagram showing the configuration of an interpolation circuit that has been proposed by the applicant in patent document 1.
Figure 2:
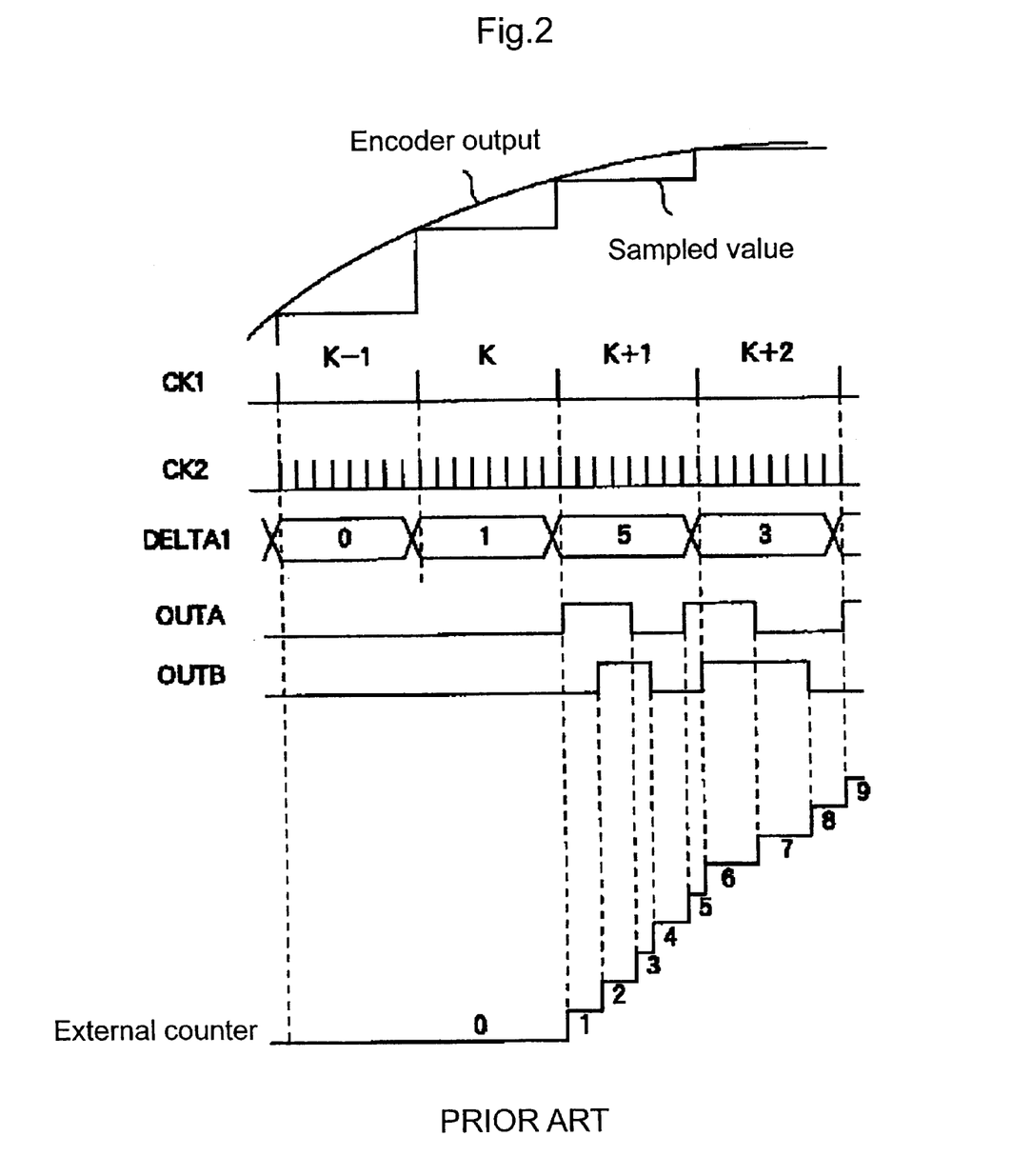
FIG. 2 is a time chart showing the operation of the same.

The applicant has proposed in Japanese Patent Laid-Open Publication No. Hei 10-132606 (hereinafter, patent document 1) that, as shown in FIG. 1 (corresponding to FIG. 1 of patent document 1), sample-and-hold (S/H) circuits $11a$ and $11b$, A/D conversion circuits $12a$ and $12b$, a look-up table (LUT) memory 13 for generating a phase angle $\tan^{-1}(B/A)$, and a register (REG) 14 of a phase angle conversion circuit 1 generate a phase angle PH (also denoted as θ) in accordance with the outputs INA and INB of encoders (not shown) at the timing of a first clock CK1. As shown in FIG. 2 (corresponding to FIG. 3 of patent document 1), the phase angle PH is linearly interpolated with a second clock CK2 which is faster than the first clock CK1 (eight times, in patent document 1), whereby two-phase square wave signals OUTA and OUTB (also denoted as QA and QB) are output for improved dynamic precision. In the diagram, the reference numeral 2 represents a data updating circuit which includes a subtractor 21, an absolute value unit 22, a polarity detection circuit 23, a limiter 24, a polarity addition circuit 25, an adder 26, and a register 27. The reference numeral 3 represents an integrating circuit which includes a register 31, an adder 32, and a register 33. The reference numeral 4 represents a carry detection circuit, and 5 a two-phase square wave generating circuit.

Figure 3:
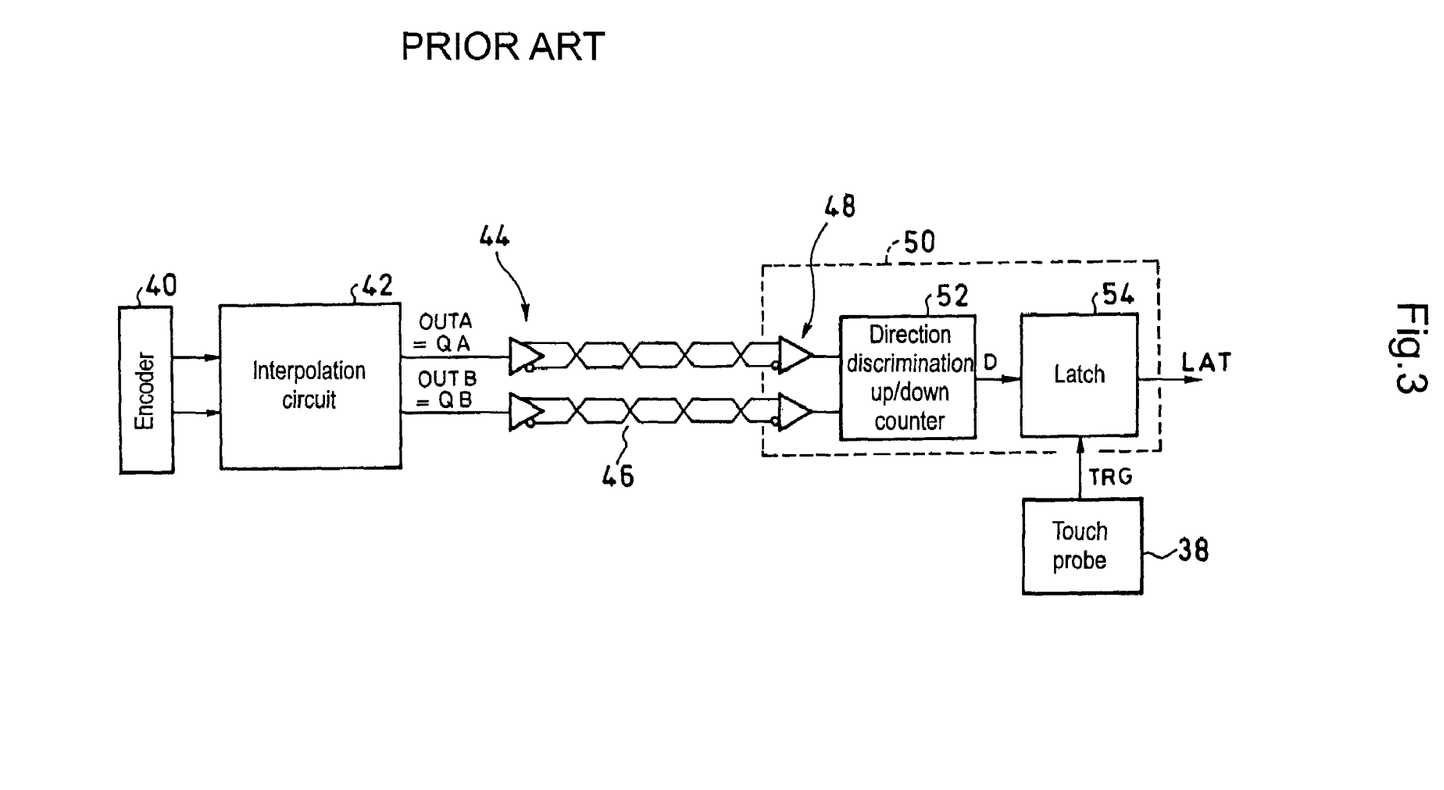
FIG. 3 is a circuit diagram showing the general configuration of an encoder apparatus which includes the interpolation circuit of patent document 1.
Figure 4:
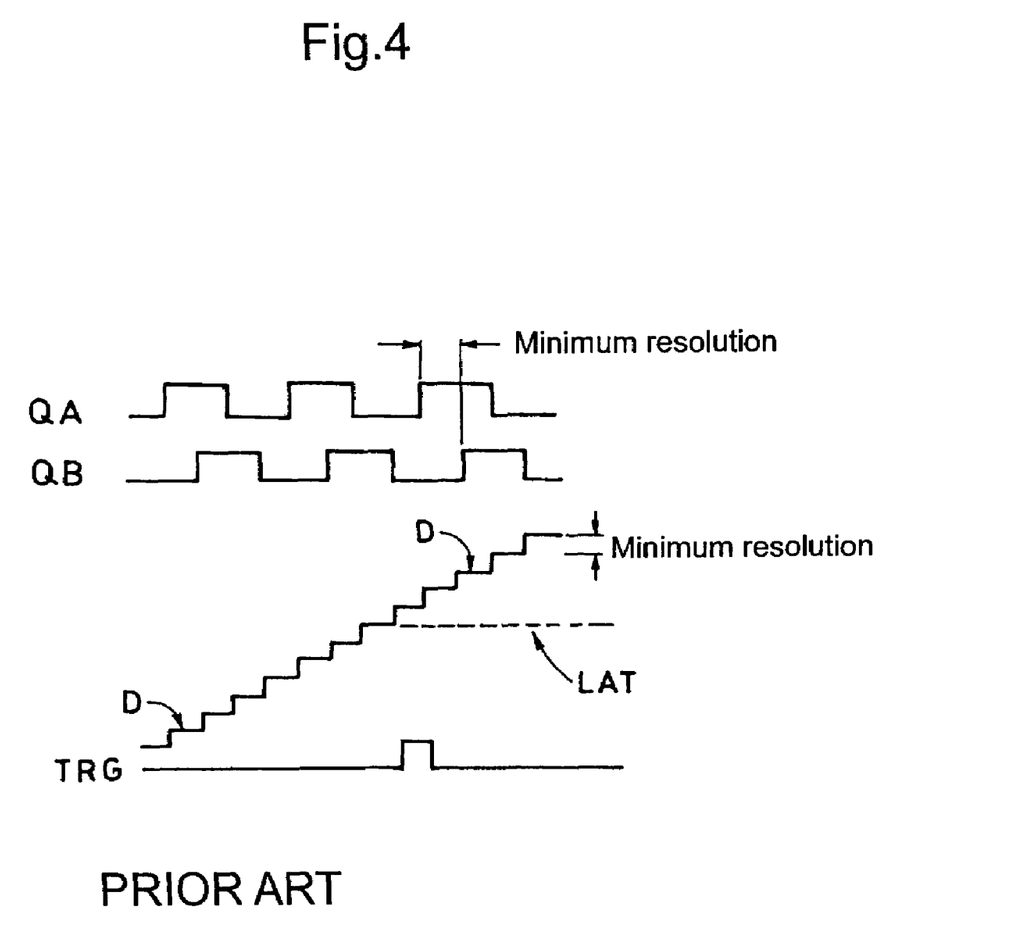
FIG. 4 is a time chart of the same.

As shown in FIG. 3 (general block diagram) and FIG. 4 (timing chart), according to this interpolation circuit 42 shown in FIG. 1 of patent document 1, the output data D of an up/down counter 52 of a counter processing unit 50 for counting two-phase square waves can be latched by a latch circuit 54 even if a trigger signal TRG is input from exterior such as a touch probe 38. This makes it possible to maintain positioning in synchronization with TRG without impairing the dynamic precision. In FIG. 3, the reference numeral 44 represents an RS485 line driver, 46 a cable, and 48 an RS485 line receiver, for example.

There are problems, however, because (1) the enhanced number of interpolations increase the two-phase square waves in weight, so that the two-phase square waves become higher in frequency even at the same feed speed. (2) The period Pck1 of the first clock CK1 also increases to lower the dynamic precision. Description will be given below in detail.

(1) Increase in the output frequency of the two-phase square waves

For example, suppose that a feed speed v=1 m/s and a signal pitch λ=20 μm. If the number of interpolations Ni is increased from 200 to 2000, the resolution R improves from 0.1 μm to 0.01 μm. In the meantime, the edge interval Δt between the two-phase square waves decreases from 10 MHz (=1 m/s÷0.1 μm) to 100 MHz (=1 m/s÷0.01 μm).

This makes it impossible to use inexpensive transmission modes having transfer rates of around 10 to 40 MHz, such as RS422 and RS485.

One of the techniques for avoiding this is to integrate the function of the up/down counter 52 of the two-phase square waves into the interpolation circuit 42. This can surely avoid the data transmission problem of the two-phase square waves, whereas it becomes necessary to transmit data on the counter which includes a greater amount of information. Data transmission over a distance as long as several tens of meters in a parallel fashion may increase the cost and power consumption due to the large number of cable conductors. As described in Japanese Patent Laid-Open Publication No. 2000-33785 (hereinafter, patent document 2), a serial data transmission mode has thus been known.

This serial data transmission mode is commonly used for numerical control (NC) machines in particular. Signals synchronous with a data request signal RQ from an NC machine are output (DT), for example, in a start-stop manner. The output period is around 50 to 200 μs.

Here, in order to improve the positioning accuracy of the control machine, high dynamic precision is required of the position data with respect to RQ. This requires high-precision synchronization of the sampling time for the A/D conversion (ADC). For example, given a feed speed of 10 mm/s and a dynamic precision of 10 nm, a synchronization precision of 1 μs or below is required (10 mm/s÷10 nm=1 μs).

(2) Increase in the ADC sampling period Pck1

On the other hand, the ADC sampling period Pck1 is also limited. When the ADC bit length is increased for the sake of a greater number of interpolations, the A/D conversion time usually increases. Moreover, when the offsets and amplitude ratio of the two-phase sinusoidal waves are corrected to improve the interpolation precision as described in Japanese Patent Laid-Open Publication No. Hei 10-311741 (hereinafter, patent document 3), the sampling period Pck1 increases because of the operation time. As a result, the sampling period Pck1 sometimes becomes greater than synchronization errors. This requires some techniques for avoiding this and reducing synchronization errors.

Furthermore, the use of the ADC circuit having a greater number of bits for high resolution has also produced the problem of increased operation time.

SUMMARY OF THE INVENTION

The present invention is made to obviate above problems and object of this invention is to reduce synchronization errors between the external data request signal and the interpolation data for improved dynamic precision.

The foregoing object of the present invention has been achieved by the provision of a method of interpolating an encoder output for interpolating two-phase sinusoidal signals output from an encoder through sample-and-hold and A/D conversion, and outputting data in accordance with a data request signal from exterior, the method comprising: arranging a direction discrimination up/down counter near a two-phase square-wave uniform pulse generating circuit; and latching and outputting data by using a signal obtained by delaying the data request signal.

The direction discrimination up/down counter may be arranged within the same IC as the two-phase square-wave uniform pulse generating circuit is.

The data request signal may be delayed by at least twice a sampling period of the A/D conversion.

The foregoing object of the present invention has also been achieved by the provision of a method of interpolating an encoder output for interpolating two-phase sinusoidal signals output from an encoder through sample-and-hold and A/D conversion, and outputting data in accordance with a data request signal from exterior, the method comprising: counting time from sampling of the A/D conversion to a data request; and interpolating data based on the counted time.

The interpolation may be either linear interpolation or curve interpolation.

The foregoing object of the present invention has also been achieved by the provision of a method of interpolating an encoder output for interpolating two-phase sinusoidal signals output from an encoder through sample-and-hold and A/D conversion, and outputting data in accordance with a data request signal from exterior, the method comprising performing sampling of the A/D conversion in synchronization with the data request signal.

The present invention also provides a circuit for interpolating an encoder output for interpolating two-phase sinusoidal signals output from an encoder through sample-and-hold and A/D conversion, and outputting data in accordance with a data request signal from exterior, the circuit comprising: a direction discrimination up/down counter arranged near a two-phase square-wave uniform pulse generating circuit; and a delay circuit for delaying the data request signal, and wherein data is latched and output by using output of the delay circuit.

The present invention also provides a circuit for interpolating an encoder output for interpolating two-phase sinusoidal signals output from an encoder through sample-and-hold and A/D conversion, and outputting data in accordance with a data request signal from exterior, the circuit comprising: a count circuit for counting time from sampling of the A/D conversion to a data request; and an interpolation and approximation circuit for interpolating data based on the counted time.

The present invention also provides a circuit for interpolating an encoder output for interpolating two-phase sinusoidal signals output from an encoder through sample-and-hold and A/D conversion, and outputting data in accordance with a data request signal from exterior, wherein sampling of the A/D conversion is performed in synchronization with the data request signal.

According to the present invention, it is possible to make interpolations with a high degree of accuracy without impairing the dynamic precision even if A/D conversion requiring a long conversion time or processing requiring a long operation time is involved. This facilitates cost saving and miniaturization.

Moreover, the data at the point in time when the data request signal is input can be delayed accurately for latch or interpolation operation. This makes it possible to maintain high precision and high resolution without increasing the operation time.

These and other novel features and advantages of the present invention will become apparent from the following detailed description of preferred embodiments.

BRIEF DESCRIPTION OF THE DRAWINGS

The preferred embodiments will be described with reference to the drawings, wherein like elements have been denoted throughout the figures with like reference numerals, and wherein.

DESCRIPTION OF THE PREFERRED EMBODIMENTS

Hereinafter, exemplary embodiments of the present invention will be described in detail with reference to the drawings.

Figure 5:
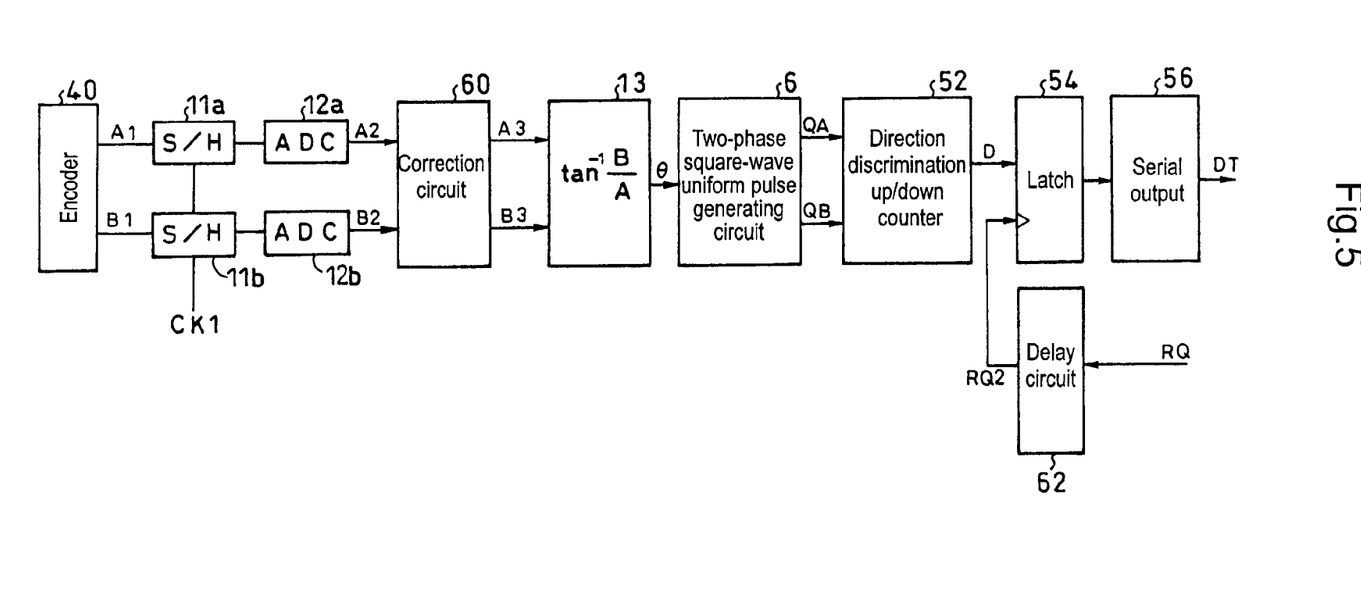
FIG. 5 is a block diagram showing the configuration of a first exemplary embodiment of the present invention.

As shown in FIG. 5, a first exemplary embodiment of the present invention is an encoder apparatus which comprises, as in the conventional example shown in FIGS. 1 and 3: an encoder 40; S/H circuits 11a and 11b; ADC circuits 12a and 12b; a LUT memory 13; a two-phase square-wave uniform pulse generating circuit 6 which corresponds to the data updating circuit 2, the integrating circuit 3, the carry detection circuit 4, and the two-phase square wave generating circuit 5; a direction discrimination up/down counter 52; and a latch circuit 54. A correction circuit 60 for making the same offset and amplitude-ratio adjustment as in patent document 3 is interposed between the ADCs 12a and 12b and the LUT 13.

While two-phase square waves are typically used to transmit data, high-frequency transmission is difficult as described in the foregoing problems. In the present exemplary embodiment, the direction discrimination up/down counter 52 is thus arranged near the two-phase square-wave uniform pulse generating circuit 6 (or within the same IC).

Then, a delay circuit 62 for delaying a data request signal RQ by twice the ADC sampling period Pck1 is provided so that the latch circuit 54 is operated to latch data in accordance with the output signal RQ2 of this delay circuit 62. A serial output circuit 56 outputs serial data DT to an external NC system or the like through a cable.

To establish synchronization with the delay time of the two-phase square-wave uniform pulses, the delay circuit 62 delays RQ by 2×Pck1 to generate the signal RQ2 as a latch signal.

Figure 6:
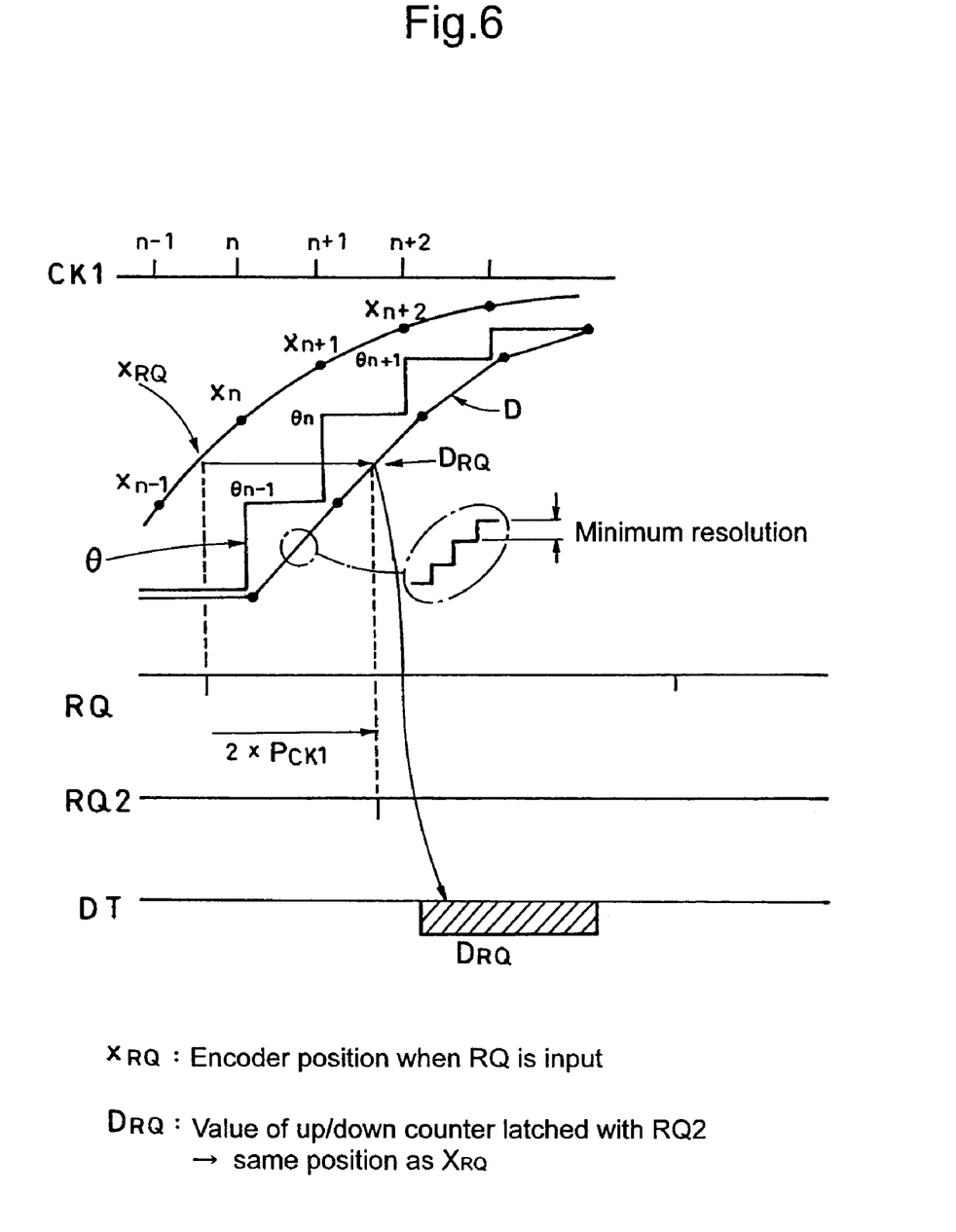
FIG. 6 is a timing chart showing the operation of the first exemplary embodiment.

FIG. 6 shows the timing chart. The symbols $X_{n-1}$, $x_n$, $X_{n+1}$, ... represent encoder positions. The symbol n represents the order of a first clock CK1. Suppose that RQ is input between $x_{n-1}$ and $x_n$. There occurs a time lag of θ with respect to x, due to the conversion time of the ADC 12a and 12b, the operation of the correction circuit 60, and $\tan^{-1}$ (B/A) conversion of the LUT 13. This time lag is matched with a sampling period Pck1 since the dynamic precision improves when the ADCs have Pck1 as short as possible. The two-phase square-wave uniform pulse generating circuit 6 also causes an additional delay Pck1. Positional errors can thus be minimized by latching the data D with the signal RQ2 which is obtained by delaying RQ by 2×Pck1.

Pipelined ADCs may sometimes have a delay time $t_{ADC}$ exceeding Pck1, depending on the number of pipeline stages. In this case, the data D can be latched with a signal RQ2 that is obtained by delaying RQ by time $(t_{ADC}+t_{QUAD})$, or the sum of the delay time of the ADCs and the delay time $(t_{QUAD}=Pck1)$ of the two-phase square-wave uniform pulse generating circuit.

Next, a second exemplary embodiment of the present invention will be described in detail.

Figure 7:
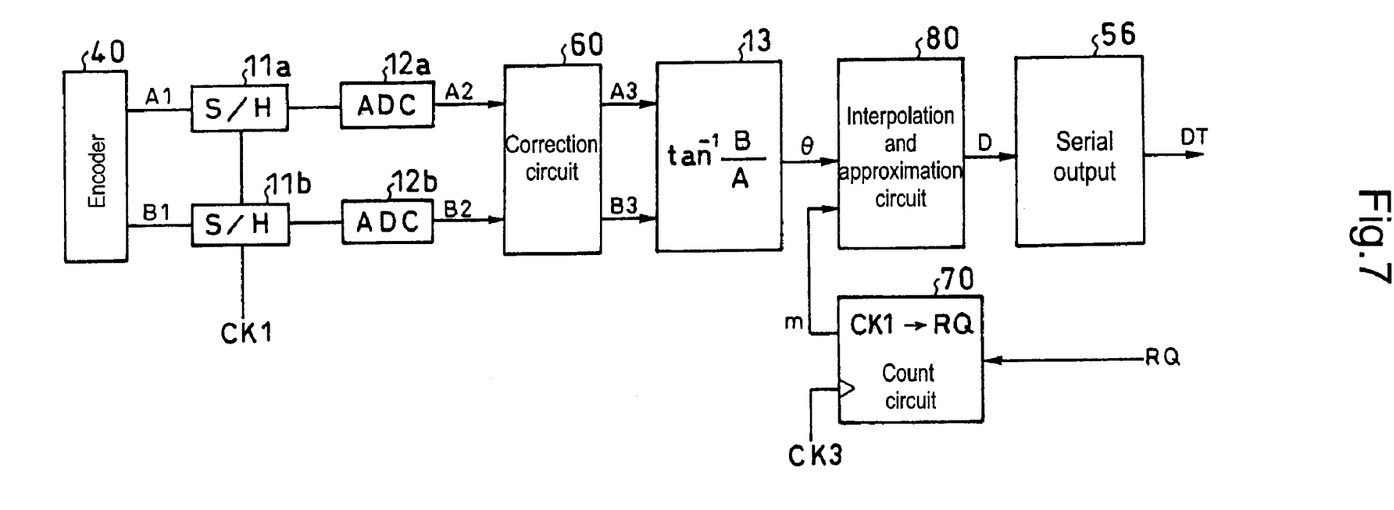
FIG. 7 is a block diagram showing the general configuration of a second exemplary embodiment of the present invention.

As shown in FIG. 7, the present exemplary embodiment uses a CK1-to-RQ time difference count circuit 70 and an interpolation and approximation circuit 80 instead of the two-phase square-wave uniform pulse generating circuit 6 and the direction discrimination up/down counter 52 of the first exemplary embodiment shown in FIG. 5.

Figure 8:
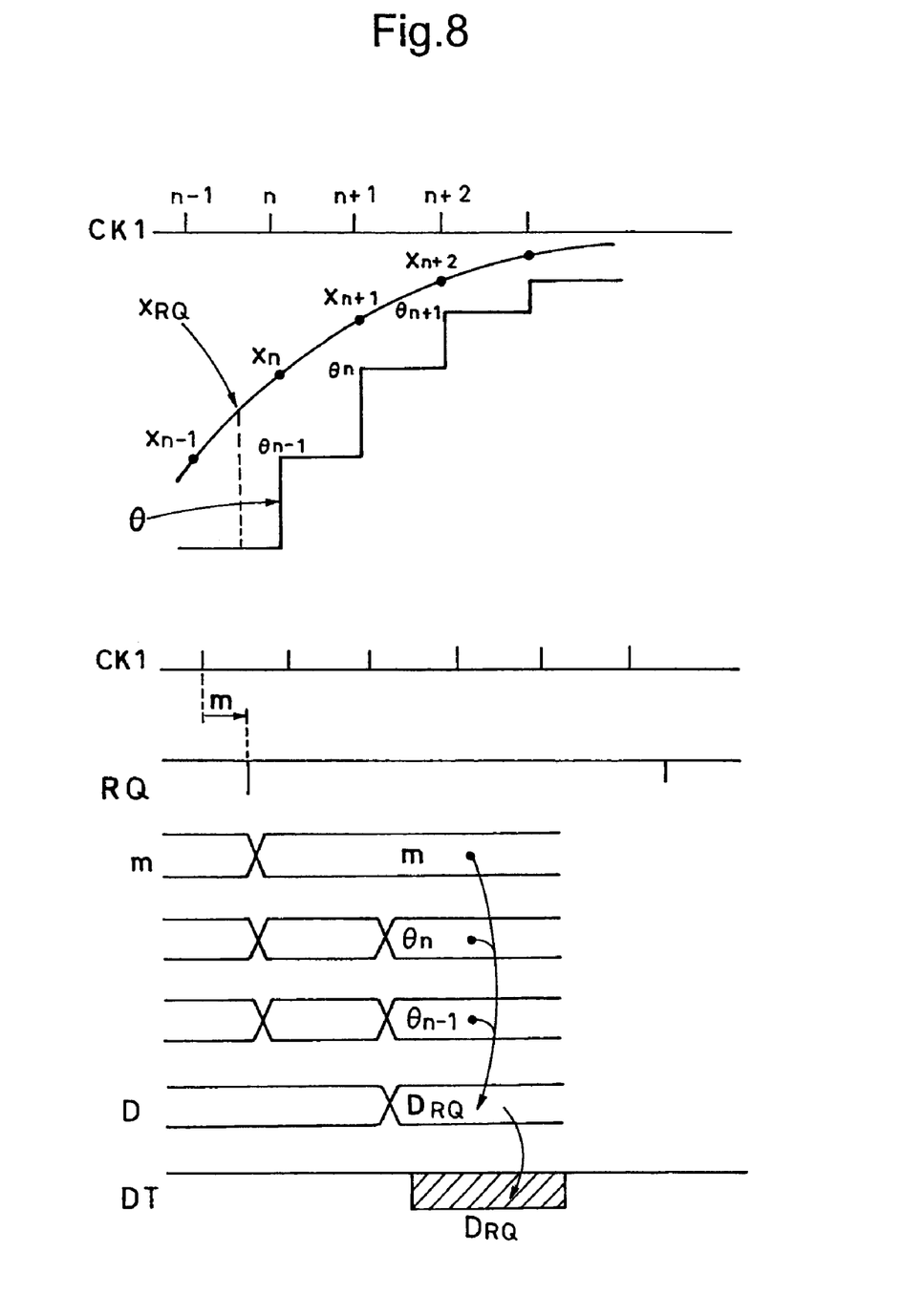
FIG. 8 is a block diagram showing the configuration of a count circuit according to the second exemplary embodiment.
Figure 9:
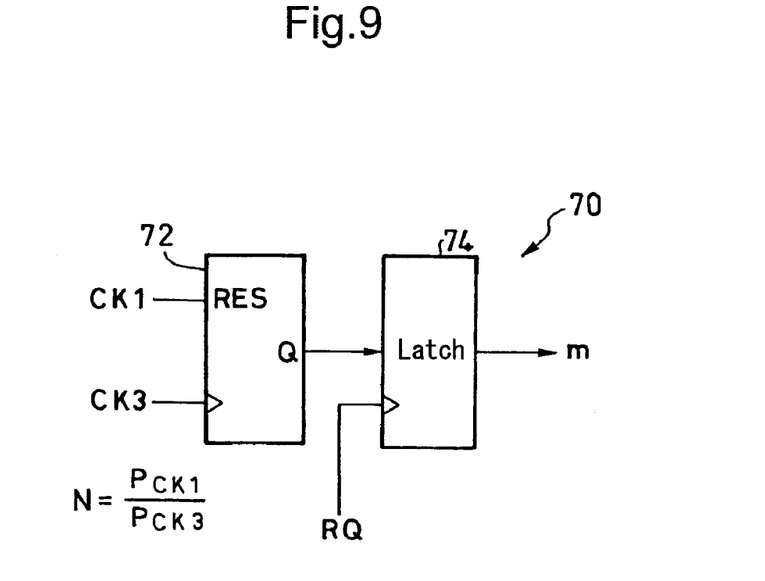
FIG. 9 is a timing chart showing the operation of the second exemplary embodiment.

The time difference count circuit 70 is a circuit for counting the time difference m between CK1 and RQ, shown in the timing chart of FIG. 8. As shown in detail in FIG. 9, the time difference count circuit 70 is composed of an up/down counter 72 and a latch circuit 74.

Here, a third clock CK3 intended for the up/down counter 72 has a frequency N times that of the first clock CK1, and N=Pck1/Pck3. This makes it possible to create m by using the up/down counter 72 and the latch circuit 74 of FIG. 9. If N is a power of 2, such as 32 and 64, the division can be made easily by bit shifting.

Figure 10:
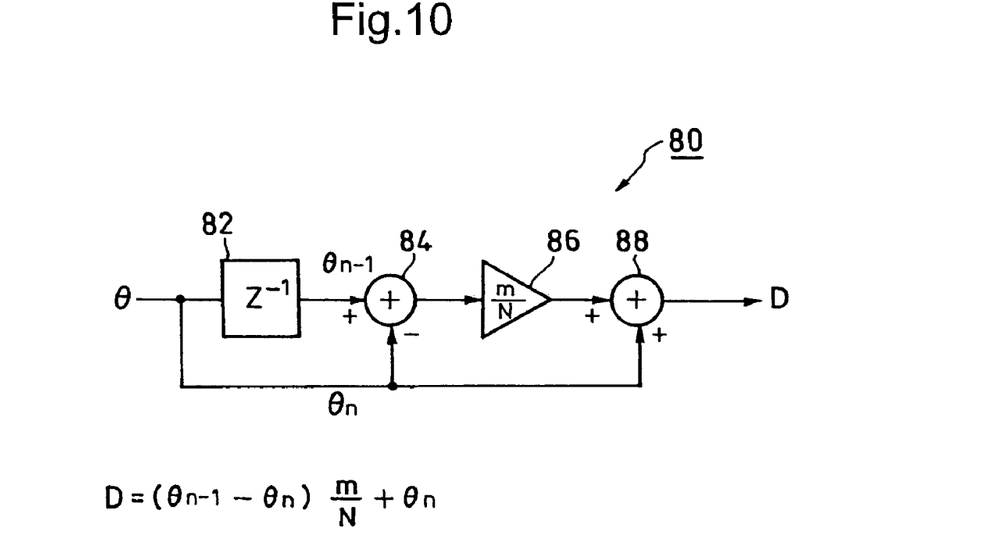
FIG. 10 is a block diagram showing the configuration of an interpolation and approximation circuit used in the second exemplary embodiment.

As shown in FIG. 10, the interpolation and approximation circuit 80 is composed of a register $(Z^{-1})$ 82, an adder 84, a multiplier 86, and an adder 88. The interpolation and approximation circuit 80 generates linearly interpolated data as shown by the following equation:

$$D=(\theta_{n-1}-\theta_n)(m/N)+\theta_n \quad (1)$$

As in the first exemplary embodiment, this data is serially output from the serial output circuit 56.

According to this second exemplary embodiment, it is possible to output linearly approximated and interpolated positions at higher speed than in the first exemplary embodiment.

It should be appreciated that the interpolation and approximation circuit 80 may employ either the method of the equation (1), shown in FIG. 10, or a method of the following equivalent equation based on $\theta_{n-1}$:

$$D=(\theta_n-\theta_{n-1})\times\{1-(m/N)\}+\theta_{n-1} \quad (2)$$

Moreover, it is even possible to employ a method based on Newton's interpolation by using a quadratic curve with consideration given to the acceleration, as exemplified by the following rather complicated equation:

$$D=\theta_{n-2}+(\theta_{n-1}-\theta_{n-2})\{1+(m/N)\}+(\frac{1}{2})(\theta_n-2\theta_{n-1}+\theta_{n-2})\\\{1+(m/N)\}(m/N) \quad (3)$$

As in FIG. 10, this equation (3) can also be realized by multipliers and adders.

Figure 11:
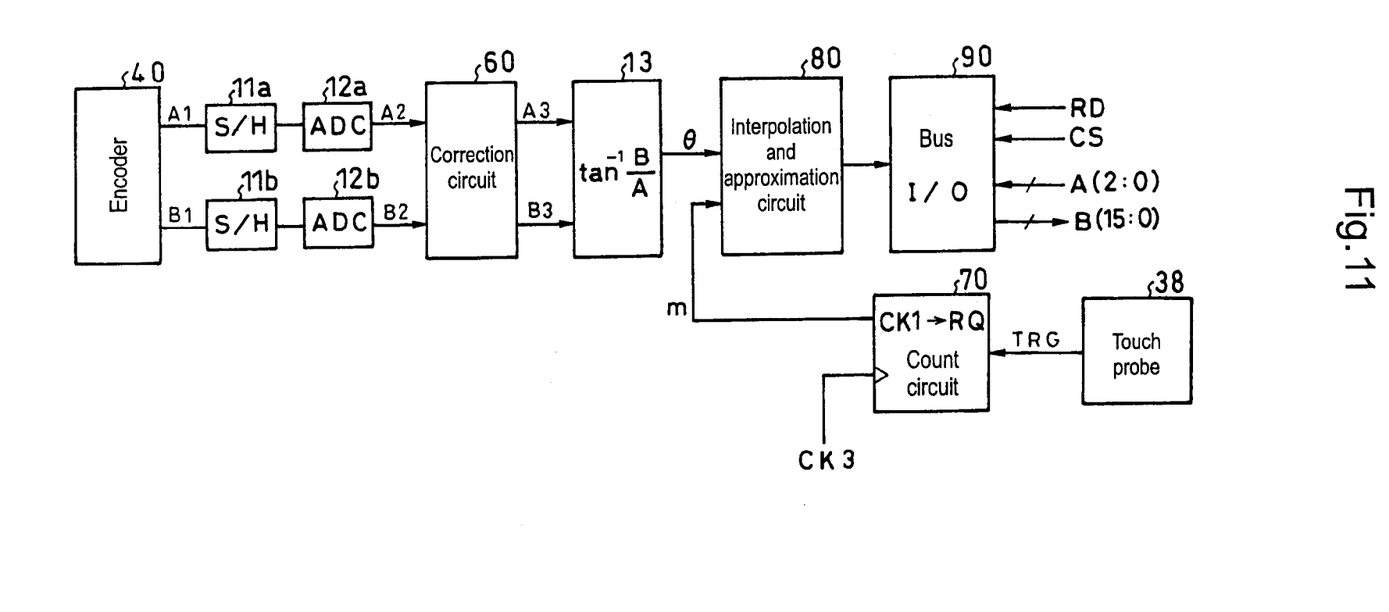
FIG. 11 is a block diagram showing the configuration of a third exemplary embodiment of the present invention.

Next, a third exemplary embodiment of the present invention will be described with reference to FIG. 11.

The present exemplary embodiment also includes the same time difference count circuit 70 and interpolation and approximation circuit 80 as in the second exemplary embodiment, whereas the output waveforms are of bus output. More specifically, a trigger TRG is input from a touch probe 38 or a scanning probe. A bus I/O circuit 90 arranged on the output side of the interpolation and approximation circuit 80 outputs synchronous data D from a 16-bit bus B(15:0) while switching a 3-bit address A(2:0), for example.

The mode of output is not limited in particular. The object of improving the synchronization precision through linear interpolation or quadratic interpolation of position can be achieved by any other mode of output such as full-bit parallel output, and regardless of the control periods or the sources of the synchronizing signals such as a probe.

Figure 12:
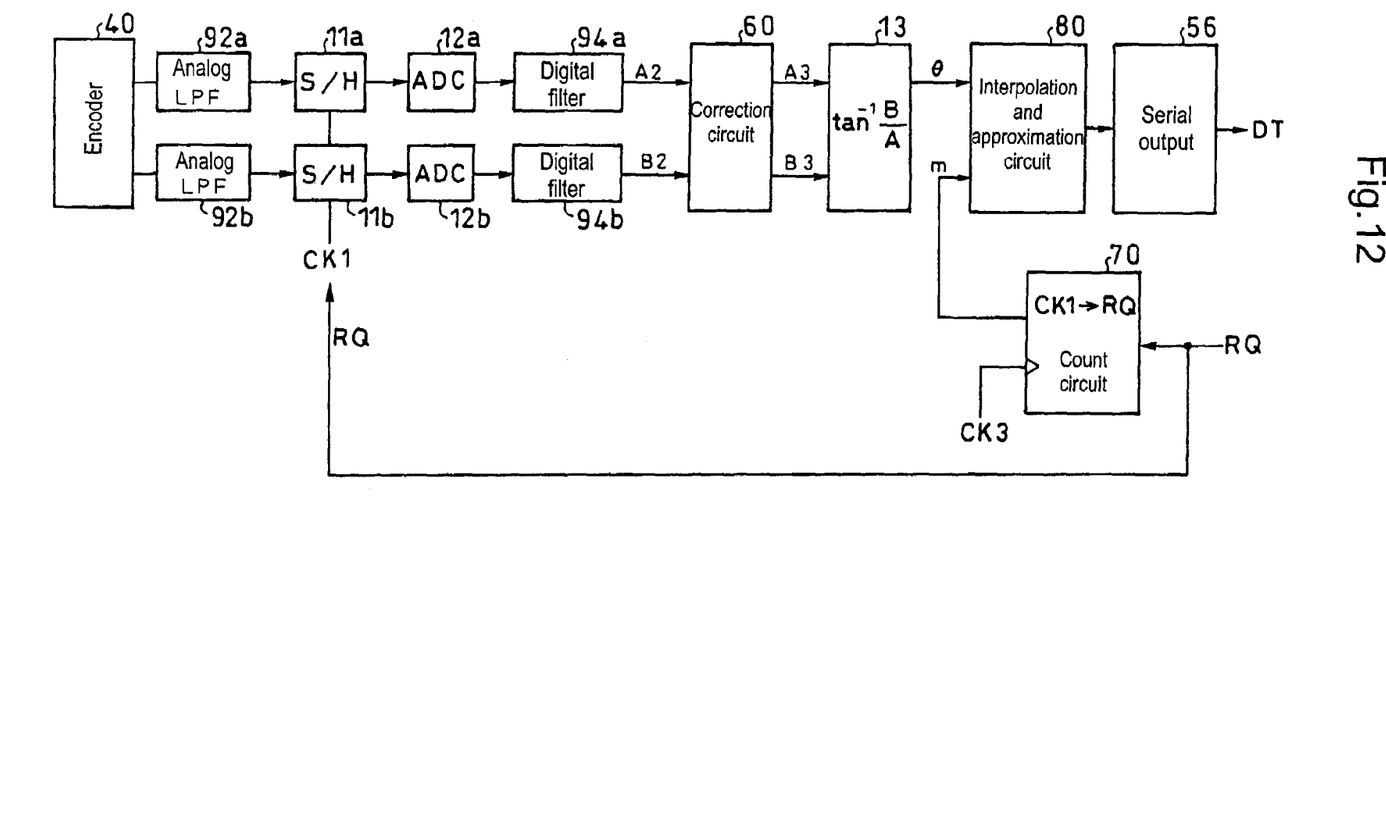
FIG. 12 is a block diagram showing the configuration of a fourth exemplary embodiment of the present invention.

Now, as in a fourth exemplary embodiment shown in FIG. 12, the ADC sampling may be synchronized with an external trigger (RQ). More specifically, if the external trigger (RQ) is input continuously, and the trigger satisfies the condition of having a sufficiently high speed with a constant period, the ADCs may make sampling in synchronization with the external trigger. In the diagram, the reference numerals 92a and 92b represent analog low-pass filters (LPF), and 94a and 94b digital filters.

The present exemplary embodiment is one for using digital filters for ADC output, which are known to have the effect of improving resolution and interpolation precision as described in Japanese Patent Laid-Open Publications No. Hei 8-201111 and No. 2005-77137. The use of digital filters requires that the ADCs have a constant sampling period. It is therefore difficult to establish perfect synchronization with the external trigger and use digital filters as well, whereas the present exemplary embodiment makes it possible to obtain an output in synchronization with TRG. It should be appreciated that the digital filters may be omitted.

In any of the foregoing exemplary embodiments, the provision of the correction circuit 60 allows high-precision interpolation. Depending on the required interpolation precision, the correction circuit 60 may also be omitted.

Moreover, the phase angle θ (=PH) may be determined by using techniques other than LUT.

It should be apparent to those skilled in the art that the above-described exemplary embodiments are merely illustrative which represent the application of the principles of the present invention. Numerous and varied other arrangements can be readily devised by those skilled in the art without departing from the spirit and the scope of the invention.

What is claimed is:

1. A method of interpolating an encoder output for interpolating two-phase sinusoidal signals output from an encoder through sample-and-hold and A/D conversion, and outputting data in accordance with a data request signal from exterior, the method comprising:
   arranging a direction discrimination up/down counter near a two-phase square-wave uniform pulse generating circuit; and
   latching and outputting data by using a signal obtained by delaying the data request signal.

2. The method of interpolating an encoder output according to claim 1, wherein
   the direction discrimination up/down counter is arranged within the same IC as the two-phase square-wave uniform pulse generating circuit is.

3. The method of interpolating an encoder output according to claim 1, wherein
   the data request signal is delayed by at least twice a sampling period of the A/D conversion.

4. A method of interpolating an encoder output for interpolating two-phase sinusoidal signals output from an encoder through sample-and-hold and A/D conversion, and outputting data in accordance with a data request signal from exterior, the method comprising:
   counting time from sampling of the A/D conversion to a data request; and
   interpolating data based on the counted time.

5. The method of interpolating an encoder output according to claim 4, wherein
   the interpolation is linear interpolation.

6. The method of interpolating an encoder output according to claim 4, wherein
   the interpolation is curve interpolation.

7. A method of interpolating an encoder output for interpolating two-phase sinusoidal signals output from an encoder through sample-and-hold and A/D conversion, and outputting data in accordance with a data request signal from exterior,
   the method comprising performing sampling of the A/D conversion in synchronization with the data request signal.

8. A circuit for interpolating an encoder output for interpolating two-phase sinusoidal signals output from an encoder through sample-and-hold and A/D conversion, and outputting data in accordance with a data request signal from exterior, the circuit comprising:
   a direction discrimination up/down counter arranged near a two-phase square-wave uniform pulse generating circuit; and
   a delay circuit for delaying the data request signal, wherein
   data is latched and output by using output of the delay circuit.

9. A circuit for interpolating an encoder output for interpolating two-phase sinusoidal signals output from an encoder through sample-and-hold and A/D conversion, and outputting data in accordance with a data request signal from exterior, the circuit comprising:
   a count circuit for counting time from sampling of the A/D conversion to a data request; and
   an interpolation and approximation circuit for interpolating data based on the counted time.

10. A circuit for interpolating an encoder output for interpolating two-phase sinusoidal signals output from an encoder through sample-and-hold and A/D conversion, and outputting data in accordance with a data request signal from exterior, wherein
    sampling of the A/D conversion is performed in synchronization with the data request signal.

* * * * *